United States Patent [19]
Walker et al.

[11] Patent Number: 5,521,412
[45] Date of Patent: May 28, 1996

[54] LOW AND HIGH MINORITY CARRIER LIFETIME LAYERS IN A SINGLE SEMICONDUCTOR STRUCTURE

[75] Inventors: Howard W. Walker; Graham A. Garcia, both of San Diego, Calif.

[73] Assignee: The United States of America as represented by the Secretary of the Navy, Washington, D.C.

[21] Appl. No.: 494,858

[22] Filed: Jun. 26, 1995

Related U.S. Application Data

[63] Continuation of Ser. No. 260,155, Jun. 8, 1994, Pat. No. 5,468,674.

[51] Int. Cl.⁶ .............................. H01L 27/01; H01L 29/00
[52] U.S. Cl. ...................... 257/352; 257/507; 257/353
[58] Field of Search .................................... 257/347, 350, 257/351, 352, 353, 354, 506, 507, 523, 525, 610, 612

[56] References Cited

U.S. PATENT DOCUMENTS

| | | |
|---|---|---|
| 4,771,016 | 9/1988 | Bajor et al. . |
| 4,774,196 | 9/1988 | Blanchard . |
| 4,888,304 | 12/1989 | Nakagawa et al. . |
| 4,891,329 | 1/1990 | Reisman et al. . |
| 5,013,681 | 5/1991 | Godbey et al. . |
| 5,024,723 | 6/1991 | Goesele et al. . |
| 5,034,343 | 7/1991 | Rouse et al. . |

OTHER PUBLICATIONS

J. B. Lasky, "Wafer Bonding for Silicon–on–Insulator Technologies", *Appl. Phys. Lett.*, vol. 48, No. 1, 6 Jan. 1986, pp. 78–80.

C. Harendt, "Silicon–on–Insulator Films Obtained by Etchback of Bonded Wafers", *Journal of the Electrochemical Society*, vol. 136, No. 10, Oct. 1989, 3547–3548.

*Primary Examiner*—Wael M. Fahmy
*Attorney, Agent, or Firm*—Harvey Fendelman; Thomas Glenn Keough; Eric James Whitesell

[57] ABSTRACT

A method for forming a semiconductor structure having a layer of low minority carrier lifetime and a layer of high minority carrier lifetime comprises the steps of forming a silicon dioxide layer on a layer of low minority carrier lifetime silicon of a silicon-on-sapphire handle wafer and another layer of silicon dioxide on a layer of high minority carrier lifetime silicon of a bulk silicon device wafer. The silicon dioxide layers are placed in contact and annealed to form a bonded structure having an annealed layer of silicon dioxide. The layer of bulk silicon is then thinned. The thinned layer of bulk silicon and the annealed silicon dioxide layer are patterned by photolithography to form mesas of high minority carrier lifetime silicon and to expose regions of low minority carrier lifetime silicon on the bonded structure.

3 Claims, 1 Drawing Sheet

LOW AND HIGH MINORITY CARRIER LIFETIME LAYERS IN A SINGLE SEMICONDUCTOR STRUCTURE

STATEMENT OF GOVERNMENT INTEREST

The invention described herein may be manufactured and used by or for the Government of the United States of America for governmental purposes without the payment of any royalties thereon or therefor.

This is a continuation of application Ser. No. 08/260,155 now U.S. Pat. No. 5,468,674 filed Jun. 8, 1994.

BACKGROUND OF THE INVENTION

The present invention relates to the fabrication of semiconductor structures. More specifically, the present invention relates to a method of forming low and high minority carrier lifetime layers in a single semiconductor structure. Minority carrier lifetime is defined as the average time between generation and recombination of minority carriers in a semiconductor structure. Low minority carrier lifetimes are considered to be less than one microsecond, while high minority carrier lifetimes are considered to be more than one microsecond.

Silicon-on-insulator (SOI) is a well known method for fabricating integrated circuits that offers several advantages over devices formed from bulk silicon, such as higher switching speed and reduced power consumption due to reduced junction capacitance. Other advantages of devices formed by SOI are avoidance of latch-up and improved tolerance to transient ionizing radiation.

A well known method for fabricating an SOI structure having a low minority carrier lifetime is to grow silicon epitaxially on a sapphire substrate to obtain a silicon-on-sapphire (SOS) structure. Epitaxially grown silicon having a low minority carrier lifetime can be grown in uniform, carefully controlled thicknesses particularly suitable for down-scaled CMOS devices. However, SOS is not suitable for bipolar transistors and CCD devices which require a high minority carrier lifetime.

A well known method for fabricating an SOI structure having a high minority carrier lifetime is direct wafer bonding. In direct wafer bonding, a layer of silicon dioxide is formed on a surface of each of two bulk silicon wafers. The wafers are then placed together so that their respective silicon dioxide layers are in contact. The wafers are then heated so that the silicon dioxide layers fuse, forming a single bonded structure. Finally, the bulk silicon is thinned by a combination of mechanical grinding and chemical etching to a thickness suitable for manufacturing bipolar transistors and CCD devices on the bonded structure. High minority carrier lifetime bulk silicon is unsuitable for CMOS devices, however, because of variations in thickness of the thinned surface and parasitic bipolar effects that can cause latch-up.

In view of the above disadvantages and limitations of the prior art, a need exists for a method of forming both low and high minority carrier lifetime layers in a single semiconductor structure.

SUMMARY OF THE INVENTION

The present invention provides a method for forming a layer of low minority carrier lifetime (low $t_0$) silicon and a layer of high minority carrier lifetime (high $t_0$) bulk silicon in a single semiconductor structure.

The method consists of forming a layer of silicon dioxide on a silicon-on-sapphire handle wafer and another layer of silicon dioxide on a bulk silicon device wafer. The silicon dioxide layers are then placed in contact and annealed to form a bonded structure having an annealed layer of silicon dioxide.

After forming the bonded structure, the high $t_0$ bulk silicon layer is thinned to a desired uniform thickness. The thinned layer and the silicon dioxide layer are patterned to form mesas of high $t_0$ silicon and to expose regions of low $t_0$ silicon on a single semiconductor structure.

An advantage of the semiconductor structure made by the method of the present invention is that integrated circuits may be fabricated incorporating both bipolar and CMOS devices.

The presently preferred embodiment described below does not preclude other embodiments and advantages that may exist or become obvious to those skilled in the art, and is but one representative embodiment of the present invention.

The features and advantages summarized above in addition to other aspects of the present invention will become more apparent from the description, presented in conjunction with the following drawings.

DESCRIPTION OF THE INVENTION

The following description presents the best mode currently contemplated for practicing the present invention. This description is not to be taken in a limiting sense, but is presented solely for the purpose of disclosing how the method of the present invention may be implemented. The scope of the invention should be determined with reference to the claims.

Figure 1:
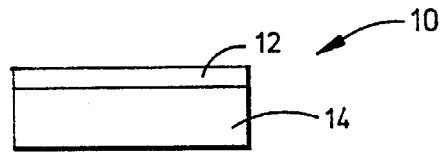
FIG. 1 is a cross-section of the silicon-on-sapphire handle wafer.
Figure 2:
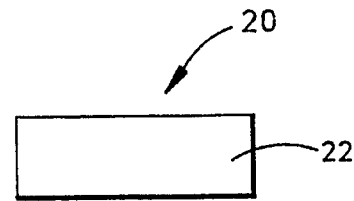
FIG. 2 is a cross-section of the bulk silicon device wafer.

An implementation of the method for forming a semiconductor structure having low and high minority carrier lifetime layers is shown in the sequence of figures beginning with FIG. 1. FIG. 1 is a cross section of a silicon-on-sapphire handle wafer 10 having a layer 12 of low $t_0$ silicon formed on the upper surface of a sapphire substrate 14 using well known techniques. FIG. 2 is a cross section of a device wafer 20 composed of a commercially available high $t_0$ bulk silicon layer 22.

Figure 3:
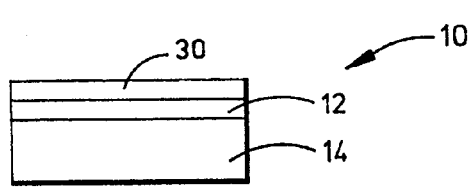
FIG. 3 is a cross-section of the silicon-on-sapphire handle wafer after forming the silicon dioxide layer.
Figure 4:
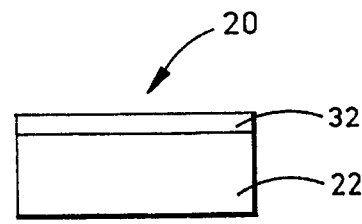
FIG. 4 is a cross-section of the bulk silicon device wafer after forming the silicon dioxide layer.
Figure 5:
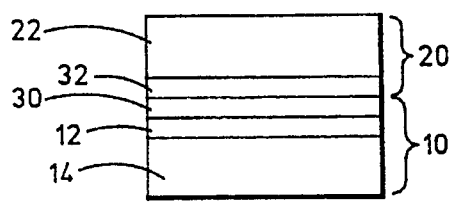
FIG. 5 is a cross-section of the handle and the device wafers with the silicon dioxide layers in contact for annealing.

Referring to FIG. 3, a silicon dioxide layer 30 may be formed as shown on silicon layer 12 of handle wafer 10 using well known techniques. Similarly in FIG. 4 a silicon dioxide layer 32 may be formed as shown on bulk layer 22 of device wafer 20. FIG. 5 shows the exposed surfaces of silicon dioxide layers 30 and 32 placed in contact for annealing. The annealing may be performed using well known techniques such as described in "Wafer Bonding for Silicon-on-Insulator Technologies", *Applied Physics Letter*, 1986, 48(1) 78–80. By way of example, silicon dioxide layers 30 and 32 may be annealed by heating handle wafer 10 and device wafer 20 to a temperature of 700° C. for one hour in an oxygen ambient.

Figure 6:
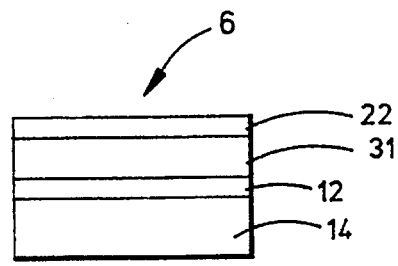
FIG. 6 is a cross-section of the semiconductor structure formed after annealing the silicon dioxide layers and thinning the bulk silicon layer.

Annealing silicon layers 30 and 32 causes handle wafer 10 and device wafer 20 to form a bonded structure 6 having an annealed silicon dioxide layer 31 as shown in FIG. 6. Bulk silicon layer 22 may then be thinned to a thickness in the range of 1 to 10 micrometers, for example, by machine polishing and chemical etching according to well known techniques, as described in "Silicon-on-Insulator Films Obtained by Etchback of Bonded Wafers", C. Harendt et al., *Journal of the Electrochemical Society*, 1989, 136(11) 3547–3548.

Figure 7:
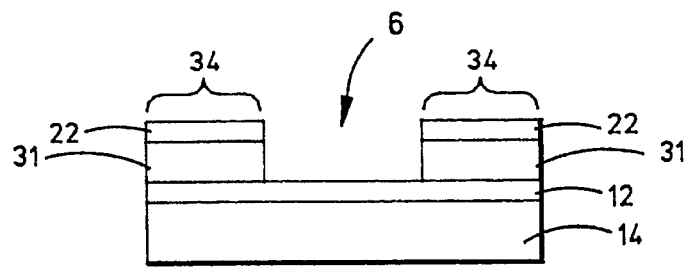
FIG. 7 is a cross-section of the semiconductor structure after patterning the thinned bulk silicon layer and the annealed silicon dioxide layer.

FIG. 7 shows bulk silicon layer 22 and annealed silicon dioxide layer 31 after patterning using well known techniques such as photolithography to form mesas 34 of high $t_0$ silicon layer 22 and to expose regions of low $t_0$ silicon layer 12 on bonded structure 6.

Additional epitaxial silicon layers may be formed by well known techniques such as chemical vapor deposition and solid phase regrowth to form p-type and n-type junctions on the semiconductor structure described above.

Other modifications, variations, and applications of the present invention may be made in accordance with the above teachings other than as specifically described to practice the invention within the scope of the following claims.

We claim:

1. A semiconductor structure comprising:

a first active layer of low minority carrier lifetime epitaxial silicon-on-sapphire;

a first silicon dioxide layer formed on said first active layer, said first silicon dioxide layer having a first exposed surface;

a second active layer of high minority carrier lifetime bulk silicon;

a second silicon dioxide layer formed on said second active layer, said second silicon dioxide layer having a second exposed surface, wherein said first exposed surface and said second exposed surface are positioned in mutual contact and annealed to form a bonded structure, said bonded structure having an annealed silicon dioxide layer, wherein said second active layer is thinned, and wherein said second active layer and said annealed silicon dioxide layer are patterned to form mesas in said second active layer and to expose regions on said first active layer.

2. The semiconductor structure of claim 1, further comprising a layer of semiconductor material formed on said bonded structure.

3. The semiconductor structure of claim 2, wherein said semiconductor material incorporates solid phase regrowth.

* * * * *